United States Patent
Brokaw et al.

(10) Patent No.: US 7,801,688 B2
(45) Date of Patent: Sep. 21, 2010

(54) CRYSTALSYM PROCESS

(76) Inventors: Harold Edward Brokaw, 362 London Rd., Asheville, NC (US) 28803-2804; Mohammed Chafchaouni, 10, Avenida Reyes Catslicos, 3IZ, Melilla, Melilla (ES) 52002

( * ) Notice: Subject to any disclaimer, the term of this patent is extended or adjusted under 35 U.S.C. 154(b) by 564 days.

(21) Appl. No.: 10/892,026

(22) Filed: Jul. 14, 2004

(65) Prior Publication Data
US 2006/0020392 A1    Jan. 26, 2006

(51) Int. Cl.
*G06F 19/00* (2006.01)
(52) U.S. Cl. ........................................ 702/27
(58) Field of Classification Search .................. 702/27
See application file for complete search history.

(56) References Cited

U.S. PATENT DOCUMENTS 6,197,495 B1 * 3/2001 Qiu et al. ........................ 435/4
2003/0198997 A1 * 10/2003 Von Dreele .................. 435/7.1

OTHER PUBLICATIONS

Qin et al. "Lattice Parameters from Direct-Space Images at Two Tilts," Ultramicroscopy et al. (Apr. 2003) vol. 94, pp. 245-262.*

\* cited by examiner

*Primary Examiner*—Jerry Lin

(57) ABSTRACT

The CrystalSym process is a logical process. It enables users of the process to easily construct symmetric systems of objects within a 3D virtual space. This process utilizes the gamut of the crystallographic 3D space filling symmetry groups of which there are 230, as well as subgroups of these 230 groups. These subgroups include point groups, line groups, frieze groups, plane groups, rod groups and layer groups. It also utilizes a certain class of non-space filling point groups.

11 Claims, 1 Drawing Sheet

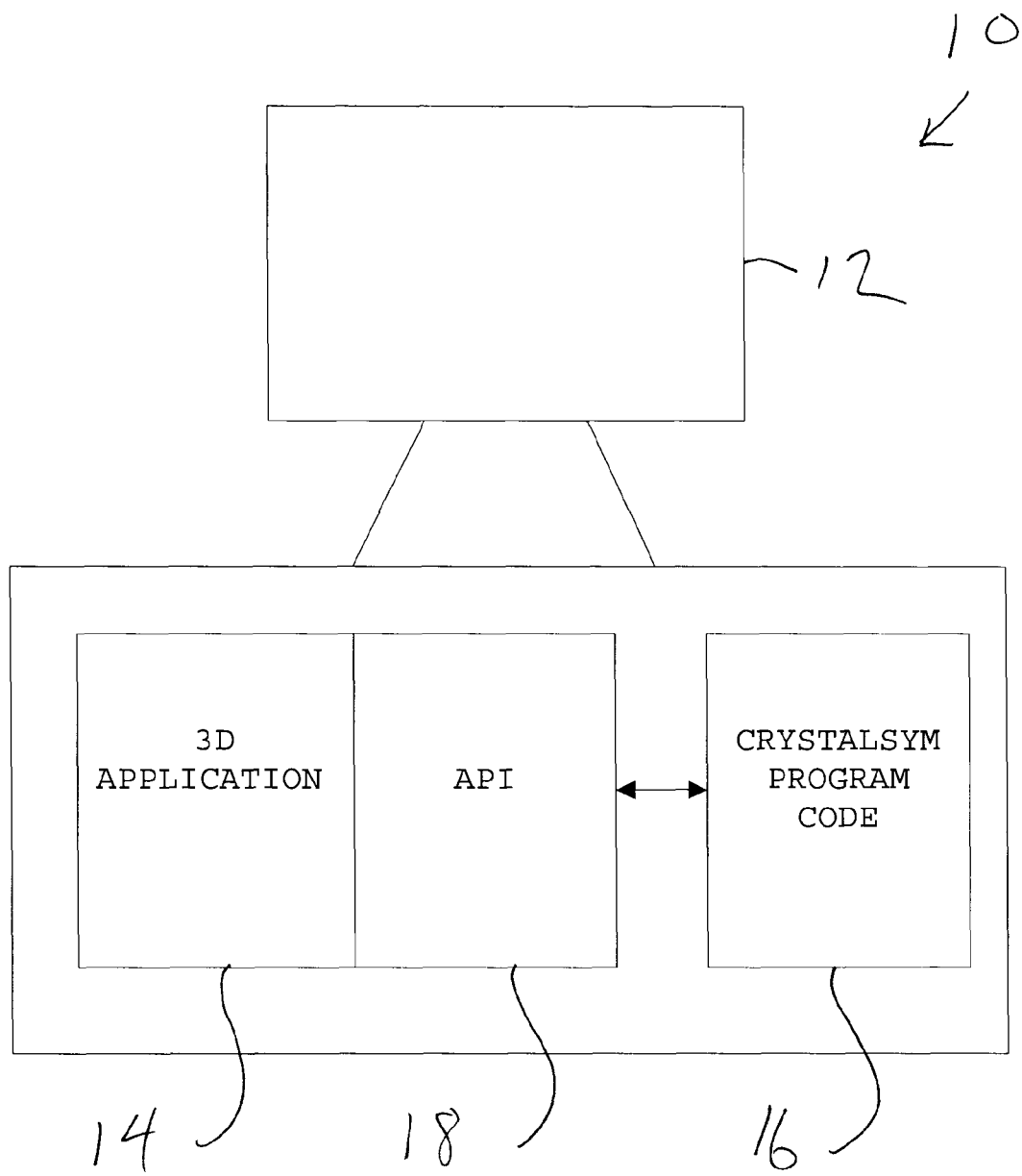

CRYSTALSYM PROCESS

CROSS REFERENCE TO RELATED APPLICATIONS

Not Applicable

STATEMENT REGARDING FEDERALLY SPONSORED RESEARCH AND DEVELOPMENT

Not Applicable

REFERENCE TO SEQUENCE LISTING, A TABLE, OR A COMPUTER PROGRAM LISTING COMPACT DISK APPENDIX

Accompanying the application is one compact disk. The disk is in MS Windows FAT format. The files on the disk are ASCII files. The names of the files are:
PointGroups_0D.spg
PointGroups_1D.spg
PointGroups_2D.spg
PointGroups_3D.spg
LineGroups.spg
FriezeGroups.spg
RodGroups.spg
PlaneGroups.spg
LayerGroups.spg
SpaceGroups.spg
CrystalSymPatentApplication.doc The .spg files are referenced, and their format and use is described, in Chapter IV of the section titled DETAILED DESCRIPTION OF THE INVENTION. These files are ASCII data files which contain all of the space group operation information needed for each space group category used by the CrystalSym process. These categories, and the names of the operations within each of them, are enumerated in Chapter V of the DETAILED DESCRIPTION OF THE INVENTION.

BACKGROUND OF THE INVENTION

This invention is in the field of Computational Processes within the sub-fields of Computer Modeling and Computer Imagery (Computer Graphics). It utilizes the mathematics of space group symmetry as defined within the fields of Mathematics and Crystallography.

This invention may be utilized within any field which makes use of computer modeling, whether for educational, recreational, research, design, manufacturing or other uses. This includes the fields of mathematical and scientific research and education, 3D modeling, architecture, millinery, plastic art, kinetic art, image synthesis and animation, database interfaces, computer and arcade games, puzzles, music, visual music, virtual reality and others.

BRIEF SUMMARY OF THE INVENTION

In one aspect, a method is provided, which comprises creating multiple instances of at least one virtual object as selected within a host system in accordance with a selected one of a plurality of crystallographic space groups and associated parameter values, grouping the resulting set of virtual object instances as a unit cell having an origin, and outputting the unit cell to the host system.

In another aspect, a method is provided, which comprises creating multiple instances of at least one virtual object as selected within a host system in accordance with a selected one of a plurality of crystallographic space groups and associated parameter values, each of the crystallographic space groups being defined as associated lattice parameters, a set of matrices in unit cell space, a Cartesian space to unit cell space conversion matrix C2U, and a unit cell space to Cartesian space transformation matrix U2C; grouping the resulting set of virtual object instances as a unit cell having an origin; and outputting the unit cell to the host system.

BRIEF DESCRIPTION OF THE SEVERAL VIEWS OF THE DRAWING

The single drawing FIGURE represents a computer system embodying the invention.

DETAILED DESCRIPTION OF THE INVENTION

By way of brief introduction, disclosed herein is a method which we call the "CrystalSym" process. The Crystalsym process is a logical process which multiplies at least one virtual object within a virtual environment, also referred to herein as a host system, according to any one of a plurality of crystallographic space groups, each defined as a set of matrices.

The CrystalSym process creates instances of the virtual object(s) in accordance with a selected one of the crystallographic space groups and associated parameter values; outputting the instances to the host system. We call the output group of instances a unit cell. Subsequently, the process can multiply the unit cell, creating instances of the unit cell in accordance with selected lattice dimension values; outputting these instances to the host system. We call the output group of unit cell instances a lattice.

The CrystalSym process solves the problem of needing a simple generic process by which one can create symmetric relationships of objects within a virtual space, i.e., the host system. It gives access to the entire gamut of three dimensional crystallographic symmetries which exist, within one easy to use process.

The CrystalSym process allows any virtual object, or set of objects, to be multiplied to create a system of object replicas (instances) of that (those) object(s) according to any symmetry relationship one might desire, such that when one moves the original object, all of the instances also move, maintaining their symmetrical relationships with the original. The CrystalSym process easily creates such systems of objects.

Several implementations of the CrystalSym process using different host systems and languages have been made. The most recent implementation is a set of scripts, written in the scripting language MEL, which are interpreted by the Maya™ Animation application.

The mathematics which are utilized by the CrystalSym process are from the Space Groups described in Crystallographic literature such as International Tables for Crystallography, Vol. A. Space-Group Symmetry, Edited by Theo Hahn, Published for The International Union of Crystallography by D. Reidel Publishing Company, Dordrecht/Boston/Lancaster/Tokyo, 1987.

Also used are the Subperiodic Groups listed in the International Tables for Crystallography, Vol. E. Subperiodic Groups, Edited by V. Kropsky and D. B. Litvin, Published for The International Union of Crystallography, by Kluwer Academic Publishers, Dordrecht/Boston/London 2002.

These mathematics are more accessibly described in basic crystallography texts on the subject such as Elementary Crystallography, Julian Martin Buerger, John Wiley & Sons, New York, N.Y. 1963, c1956.

The mathematics describes 230 unique space groups describing all possible crystal symmetries in three dimensions. Each space group is created from a combination of the translational symmetry of a unit cell including lattice centering, and the point group symmetry operations of reflection, rotation and rotoinversion (also called improper rotation). Also included are the screw axis and glide plane symmetry operations which are combinations of a rotation or reflection with a translation less than the unit cell size.

Prior art utilizing the mathematics of symmetry groups is primarily within the realm of two dimensional computer imagery. There are several implementations of similar processes which operate on two dimensional entities.

A distinguishing characteristic is that the CrystalSym process operates upon objects within a 3D space. Even when the operations are essentially 2D operations the objects being acted upon exist within a three dimensional space.

Crystallographic software usually works from analytical data to derive resulting space group symmetry information. It is always oriented toward visualizing atomic data. The objects being modeled within crystallography are atoms and bonds and molecules.

There do exist systems which present atoms and bonds visually as unit cells and lattices of unit cells. In some of them you can specify the atoms of the asymmetric unit and choose the symmetry and lattice parameters in a way that is similar to our process. These processes always are visualizing atomic structures.

A distinguishing characteristic of the CrystalSym process compared to what is accomplished within crystallography software is the ability to put any virtual object into any symmetric relationship implemented by the system. The system is not specifically oriented toward the visualization of atomic phenomena. It is totally general in its applicability.

There are many examples of two dimensional art which take advantage of 2D symmetry relationships. From wall paper to the complex mosaics of Islamic artworks, two dimensional symmetry is a well known basis for creating interesting visual motifs. There exists in the three dimensional realm many more possible symmetric relationships which could similarly be used to create interesting visual experiences.

There exist many systems for creating interesting 3D imagery. These systems are now used extensively in video and film production. However, none of these systems allow a user to systematically create visualizations of objects placed and moving in three dimensional symmetry relationships.

Chapters:
  I. Definitions
  II. Method of Specification
  III. Host System Requirements
  IV. Specification of Symmetry Operations and Data Files
  V. Specification of Parameters
  VI. Specification of the CrystalSym Process
  VII. Detail of Matrix Methods Used in Chapter VI.
  VIII. Summary of CrystalSym Methods Used in Chapter VI.

I. Definitions
  The CrystalSym Process:
    For the purposes of this description the process being described will be called the CrystalSym process.
  Crystallographic Space Groups:
    The crystallographic space groups used by the CrystalSym process are the mathematical groups which are described for example in Crystallographic literature such as International Tables for Crystallography, Vol. A. Space-Group Symmetry, Edited by Theo Hahn, Published for The International Union of Crystallography by D. Reidel Publishing Company, Dordrecht/Boston/Lancaster/Tokyo, 1987; and in the International Tables for Crystallography, Vol. E. Subperiodic Groups, Edited by V. Kropsky and D. B. Litvin, Published for The International Union of Crystallography, by Kluwer Academic Publishers, Dordrecht/Boston/London 2002.
  Symmetry Group:
    The symmetry relationships from which the user will be selecting, together form a symmetry group. These symmetry groups are mathematical entities which have been described by mathematicians and crystallographers. The symmetry relationships and groups which will be able to be selected by the users of the CrystalSym process are specified within this application.
  Asymmetric Unit:
    The object or group of objects upon which the CrystalSym process performs a symmetry operation.
  Instances:
    Distributing virtual objects means to create copies or references of the original object or objects in different locations and orientations within the virtual space. Each copy or reference to the original object or objects is called an instance.
  Unit Cell:
    The CrystalSym process creates a Unit Cell by performing a chosen symmetry operation upon an Asymmetric Unit, usually creating multiple instances of the Asymmetric Unit. The Unit Cell is the area or volume which contains every instance of the Asymmetric Unit created by the CrystalSym process. The shape of the Unit Cell volume may depend upon the Lattice (see next).
  Lattice:
    A repeated copying of (by creating instances of) objects comprising a Unit Cell via translation (that is moving each copy) specified distance(s) in one or more directions. Some lattice types may also change the size and orientation of the Unit Cell. The choice of lattice determines the shape of the Unit Cell. Conversely, the symmetry of the Unit Cell may be used to choose the Lattice which fills space completely, or most compactly, for that symmetry. There are certain space filling lattices that are possible for each category of groups (line groups, plane groups and space groups, etc.) which will be specified within this application. This application does not specify all possible Lattices which may be used by an implementation of the CrystalSym process.
  Host System:
    The CrystalSym process can be implemented within any logic system, whether software or hardware, which allows the user to create virtual objects within a three dimensional virtual space. For the purposes of this application, such systems will be called the Host System. A non-exhaustive list of potential Host Systems would include CAD/CAM systems, 3D Computer Animation programs, 3D Computer Modeling programs, Virtual Reality design programs, Virtual Reality environments, Computer Drawing and Painting programs, Web page design programs, Computer Game environments, all of which will be recognized as three dimensional creation and rendering applications. In the drawing FIGURE, a representative logic system 10, i.e. a computer system 10, includes a display 12 and is running a representative 3D application program 14.

II. Method of Specification
  Within this application the CrystalSym process will be specified by logic using pseudo-code, as it could be implemented using many possible computer languages within many possible Host Systems. In the drawing FIGURE, the CrystalSym process is represented as computer program code 16. The pseudo-code at times may look similar to C++ and utilize its constructs. Parameter names (variableNames) will be written in italics. Parameter values are written in bold.

The names chosen for this specification are not intrinsic to the process. That is, any name used for a parameter name or enumerated parameter value within this specification can be altered, as long as the alterations are consistent throughout the implementation of the process.

III. Host System Requirements

Described here is required and useful (optional) host system Application Programmers Interface (API) functionality, represented in the drawing FIGURE at 18. The functionality is described by listing an object method definition which will be used as pseudo-code to represent the functionality within this specification. The functionality of the method is then described and a notation is made of where within the specification the method is invoked. The Steps identified as to where the methods are invoked are all within the algorithm in Chapter VI.

Required Functionality: The host system will need to have the following functionality within an API which will be utilized by the CrystalSym process. With regard to the functionality of an object graph or hierarchy, if the host system does not implement such, then it is possible to implement a simple reference list database which will maintain such information in parallel with the host system. This specification does not go into the details of this option. It is assumed that any competent programmer would know how to do this.

i) HostSystem.selectedObject( );

Called in step B

This method returns the selected object or objects (if there are multiple objects selected). All Host Systems for which this process can be implemented will have a method for selecting an object or group of objects.

ii) HostSystem.createObjectInstance(object, name);

Called in Steps E)ii)a), I)i)

a) This method will create a reference to, that is, an instance of, the object and name it *name*. Actually, if this functionality is not present, if the host system can copy an object, that can be done instead. That will work fine for a static system, or one where one does not desire to maintain the symmetry if objects are moved around subsequent to their creation.

b) If one does copying, HostSystem.copyObject( ), rather than instancing, if one wishes to move the copies and maintain the symmetric relationships with the other copies made, it will be necessary to maintain a database of the relationships and get callbacks whenever a copy is moved. In the callback all the other copies in the Unit Cell and Lattice can then be moved such that they maintain their symmetric relationships.

iii) HostSystem.addParent(childObject, parentObject);

Called in Steps E)ii)b), I)ii)

a) This method adds the parentObject as a parent to the childObject. This is usually accomplished in the host system by means of a graph structure where objects can have multiple parents and multiple children.

b) If this method is not available, then one could maintain the information within a database. As with object instancing, it may in that case be necessary to have callbacks when objects are moved in order to maintain object relationships, one with another.

iv) HostSystem.setScale(object, <x_value, y_value, z_value>);

Called in Steps E)ii)d), I)iv) and [optional] Step J)iv)c)

This method sets the scale values of the specified object. The values are the scalars along each of the Cartesian axes, x, y and z.

v) HostSystem.setRotation(object, <x_value, y_value, z_value>);

Called in Steps E)ii)d), I)iv) and [optional] Step J)iv)d)

This method sets the rotation values of the specified object. The values are the rotations about each of the Cartesian axes, x, y and z. It assumes that the rotation order is first about x-axis, then about the y-axis, then about the z-axis. If another order is used, then adjust the algorithm accordingly.

vi) HostSystem.setTranslation(object, <x_value, y_value, z_value>);

Called in Steps E)ii)d), I)iv) and [optional] Step J)iv)e)

This method sets the translation values of the specified object. The values are the translations along each of the Cartesian axes, x, y and z.

v) The following standard mathematical functions:
HostSystem.sin(angle); /* sine of angle */
HostSystem.cos(angle); /* cosine tangent of angle */
HostSystem.asin(value); /* arc sine of value */
HostSystem.acos(value); /* arc cosine of value */
HostSystem.atan(value); /* arc tangent of value */
HostSystem.abs(value); /* absolute value (|value|)*/
HostSystem.sqrt(value); /* Square root of value */
HostSystem.sqr(value); /* Square (value*value)*/

Called in some of the matrix methods described in Chapter VII. HostSystem.atan(value) also is called in [optional] Steps J)iv)a) and J)iv)b).

Optional Functionality: The following functionality is useful, though not absolutely necessary. Some of the features listed here have alternative methods of implementation.

i) HostSystem.group(object, name);

Called in Steps D), F), J)ii)

a) This method groups the object which may be a single object or may be a list of objects. The new object which is the grouped object is returned by the method. This functionality assumes the host system implements some kind of graph or hierarchy as a structure for relating objects one with another.

b) If this functionality is not available, then one can handle each object individually in parallel rather than as a group. This functionality can also be created if one has the ability to create objects: HostSystem.createObject( ), then add the created object as a parent: HostSystem.addParent( ), to each of the objects in the list.

ii) HostSystem.setTransformMatrix(object, aMatrix);

Called in Steps E)ii)d), I)iv)

a) This method sets the transform matrix of object directly to be aMatrix, rather than via scale, rotation and translation values. The transform matrix embodies all of these operations, as well as shearing, in one entity.

b) In the CrystalSym process what are computed are complete transformation matrices. If there is no functionality within the host system to set the transformation matrix directly, then one must extract the scale, rotation and translation values from the matrix. There is included in the Chapter VII. Detail of Matrix Methods, algorithms for doing this. See CrystalSym.Matrix.scaleValues( ), CrystalSym.Matrix.rotationValues( ) and CrystalSym.Matrix.translationValues( ).

iii) HostSystem.setParent(childObject, parentObject);

Called in [optional] Step G)iii)

This method sets the parent of the childObject to be parentObject.

iv) HostSystem.createCube(parameterList);

Called in [optional] Step G)i)

This method returns a cube object created within the host system. The parameterList required will be specific to the host system.

v) HostSystem.addParameter(object, parameterName, parameterType);

Called in [optional] Steps H)i), H)ii), H)iii)

This method adds within the host system a parameter of parameterType named parameterName to object.

vi) HostSystem.setParameter(object, parameterName, value);

Called in [optional] Step H)iv)

This method sets within the host system a parameter of object named parameterName to value.

vii) HostSystem.createObject(parameterList);

Not called. Mentioned above in this Chapter(III.) paragraph 0064)

This method creates an object within the host system and returns it.

viii) HostSystem.copyObject(object);

Not called. Mentioned above in this Chapter(III.) paragraph 0053)

This method creates an object within the host system which is a copy of object and returns it.

IV. Specification of Symmetry Operations and Files

When a symmetry group is selected, the matrices which implement the symmetry operations for that symmetry group will need to be used. The implementer of the CrystalSym process can decide how best to retrieve the information when it is needed.

The Compact Disc Appendix includes files containing the matrices which specify the mathematics of the symmetry operations utilized by the CrystalSym process. For each SpaceGroupCategory, there is a file named: SpaceGroupCategory.spg The format of the .spg files follows a format which is specified in online SYBIL documentation. SYBIL is a crystallography program available from Tripos, Inc., 1699 South Hanley Rd., St. Louis, Mo., 63144-2319, phone: 1-800-323-2960, 1-314-647-9241. The data format is as follows:

line 1: SymmetryNumber, SymmetryName (integer, ascii—5i, 20a1)

line 2: Centrosymmetric|NonCentrosymmetric (ascii—20a1)

line 3: Number of symmetry operations to follow (integer—5i)

line 4: M_id, M(1,1), M(1,2), M(1,3), T(1) (integer, 4 floats—5x,4f10.6)

line 5: M_id, M(2,1), M(2,2), M(2,3), T(2) (integer, 4 floats—5x,4f10.6)

line 6: M_id, M(3,1), M(3,2), M(3,3), T(3) (integer, 4 floats—5x,4f10.6) etc. (three lines per symmetry operation)

Within each SpaceGroupCategory, there is a unique SymmetryNumber integer value and a corresponding unique SymmetryName for each symmetry group. On the second line, either the word "Centrosymmetric" or "Noncentrosymmetric" is included. If the value is "Centrosymmetric" that means that each symmetry operation matrix listed in the file for this symmetry group should be duplicated then inverted as an additional symmetry operation for the symmetry group. Inversion is defined according to the space of the group, ie: 1D, 2D or 3D.

The third line indicates the number of symmetry operation matrices that immediately follow for this symmetry group. There are three lines for each matrix [M]. Each matrix line may optionally contain a matrix id number in columns 1-5. It can be used to help make the files more readable but it may be absent. The other four values on the line form one column of the matrix[M] which will perform a symmetry operation.

The data which is within the spacegroups files was created by referring to crystallographic literature as well as using the online service called: Bilbao Crystallographic Server. A reference to it is in the BACKGROUND OF THE INVENTION All of the operations together are what is meant by "symmetry group".

The operations are in UnitCell space. In order to obtain a matrix which will implement the operation in Cartesian space, the matrix[M] must be pre-multiplied by a matrix [C2U] that will convert into the UnitCell space, then post multiplied by a matrix[U2C] that will transform back from the UnitCell space into Cartesian space. This is the combined matrix[SymOp]. For Equation 1 algorithm, see CrystalSym.Matrix.combine( ) in Chapter VII.

$$[SymOp]=[C2U]\times[M]\times[U2C] \quad \text{(Equation 1)}$$

[SymOp] can be used to transform the instance of the object if the host system allows one to set the transform matrix directly. Often host systems only allow the manipulation of an object's transformation matrix indirectly through specification of translate, rotate and scale values. If that is the case, one must determine these values by interpreting the resulting matrix.

The [C2U] matrix is defined as:

$$\begin{vmatrix} 1/a & -\cos\gamma/(a\cdot\sin\gamma) & (\cos\alpha\cdot\cos\gamma-\cos\beta)/ & 0 \\ & & (a\cdot\sin\gamma\cdot\text{factor}) & \\ 0 & 1/(b\cdot\sin\gamma) & (\cos\beta\cdot\cos\gamma-\cos\alpha)/ & 0 \\ & & (b\cdot\sin\gamma\cdot\text{factor}) & \\ 0 & 0 & \sin\gamma/(c\cdot\text{factor}) & 0 \\ 0 & 0 & 0 & 1 \end{vmatrix} \quad \text{(Equation 2)}$$

$$\text{factor}=(1-\cos^2\alpha-\cos^2\beta-\cos^2\gamma+2\cdot\cos\alpha\cdot\cos\beta\cdot\cos\gamma)^{0.5} \quad \text{(Equation 3)}$$

The [U2C] matrix is defined as:

$$\begin{vmatrix} a & b\cdot\cos\gamma & c\cdot\cos\beta & 0 \\ 0 & b\cdot\sin\gamma & c\cdot(\cos\alpha-\cos\beta\cos\gamma)/\sin\gamma & 0 \\ 0 & 0 & c\cdot\text{factor}/\sin\gamma & 0 \\ 0 & 0 & 0 & 1 \end{vmatrix} \quad \text{(Equation 4)}$$

Because these matrices are dependent upon the UnitCell parameters, they must be created after those parameters are specified (see Chapter V). The values for a, b, c, α, β and γ the above equations correspond with the UnitCell parameters: aVectorMagnitude, bVectorMagnitude, cVectorMagnitude, alphaAngle, betaAngle and gammaAngle respectively.

V. Specification of Parameters

Specification of parameter data required by the CrystalSym process. Selection of a set of symmetry relationships, or symmetry group, and selection of parameters associated with the chosen group.

Following are the groups of parameter data described in this chapter:
  i) Selection of SymmetryGroupCategory (can occur by default in sections ii) or iv).
  ii) Selection of Lattice parameters for the selected SymmetryGroupCategory.
  iii) Selection of Unit Cell parameters for selected SymmetryGroupCategory or Lattice.
  iv) Selection of symmetry group and/or relationships.

All of the parameters which are used by the CrystalSym process are described in this Chapter. User selection of parameter values may occur in various orders. It will depend upon how the parameter specification interface is implemented. It is possible to implement the process by only allowing selection of symmetry group and/or relationships (section iv) and using that choice to help determine SymmetryGroupCategory (section i), Lattice (section ii) and Unit Cell (section iii) parameters.

It is also possible to determine parameter data from the virtual object chosen, see optional part of Chapter VI, Step C. Such a situation might result by a previous application of the process to that object. If the chosen object has internal symmetry corresponding to a particular lattice, the symmetry of the chosen object could then be used to determine a lattice which can create copies of the Unit Cell symmetry throughout the space.

The implementation of the process may implement default or assumed values for any of the parameter data listed in this section. The process may also implement any subset of the specified groups. The implementation may use whatever form of interface is useful and/or possible, given the host system, to collect the parameter information from the user.

In the CrystalSym process, as detailed herein, it is assumed that the interface implementation enforces the constraints listed in the parameter specifications which follow. The interface logic is not detailed, as the interface is not, per se, a part of the process. However, enforcing the constraints on parameter values is required for correct results.

If the constraints are not followed, the result may be that the lattices created by the process will not be correct. It would be easy enough to add checking for the constraints within the CrystalSym process, but it is not essential to the process. The process may still yield results even if the constraints are not followed. Such results may be interesting for artists and other users of the process, therefore, for the purposes of the patent, enforcing constraints is an optional feature.

CrystalSym Parameter Tables
  i) Selection of a symmetryGroupCategory. The subsequent parameter sets are specified under the symmetryGroupCategory to which they relate.
  pseudo-code: CrystalSym.UI.getSymmetryGroupCategory( )

TABLE 1

| Parameter | Type | Value |
| --- | --- | --- |
| SymmetryGroupCategory | Enumerated | member of set:<br>{ PointGroups_0D,<br>PointGroups_1D,<br>LineGroups,<br>PointGroups_2D,<br>FriezeGroups,<br>PlaneGroups,<br>PointGroups_3D,<br>RodGroups,<br>LayerGroups,<br>SpaceGroups } | a) The values for SymmetryGroupCategory represent all of the uniform space filling (crystallographic) lattices in zero through three dimensions. There are other possible lattices which are not described in this application. Such lattices could be sparse, non-uniform or irregular. These other lattices might require additional or different parameters.

b) PointGroups_0D has no symmetry operations and is included only for the sake of completeness, to include all possible crystallographic groups from zero dimensions through three dimensions.

c) PointGroups_1D and LineGroups are groups which implement only one dimensional operations (although the operations are performed within the context of 3D space). The reason for implementing them is again for reasons of completeness. There may be some educational benefits to including the zero and one dimensional groups in the CrystalSym process.

d) PointGroups_2D, FriezeGroups and PlaneGroups are groups which implement only two dimensional operations (although the operations are performed within the context of 3D space). An additional reason to include these groups, other than the reason of completeness, even though they are sub-groups of the 3D groups, is because the 2D group names and Lattices are familiar to a larger number of people than are the 3D group names and Lattices.

e) PointGroups_3D, RodGroups, LayerGroups and SpaceGroups implement all of the crystallographic three dimensional space group operations.

ii) Selection of Lattice Parameters for the Selected SymmetryGroupCategory Pseudo-Code:

CrystalSym.UI.getLatticeParameters (symmetryGroupcategory, parameterName)

a) Some of the Lattice values have a "/" in the name. In later parts of the specification where other parameter values are dependent upon the Lattice value, sometimes only one of the names divided by the "/" are present. In that case, that is the choice to use.

b) In cases where both of the values are present, but on separate lines and the combined value is not present, then the choice will determine the nature of the Lattice. You can apply either set of conditions. For example, in the case of the Trigonal/Hexagonal value that would mean that you could use either the Trigonal or the Hexagonal Lattice conditions for the given situation.

TABLE 2

| PointGroups_0D | | |
| --- | --- | --- |
| Parameter | Type | Value |
| Lattice | Enumerated | None/Any |

TABLE 3

| PointGroups_1D,<br>LineGroups | | |
| --- | --- | --- |
| Parameter | Type | Value |
| Lattice | Enumerated | member of set:<br>{ None/Any, Row } |

TABLE 4

**PointGroups_2D,
FriezeGroups,
PlaneGroups**

| Parameter | Type | Value |
|---|---|---|
| Lattice | Enumerated | member of set: { None/Any, Oblique, Rectangular/Primitive, Rectangular/Centered, Square, Hexagonal} |

TABLE 5

PointGroups_3D

| Parameter | Type | Value |
|---|---|---|
| Lattice | Enumerated | member of set: {None/Any, Triclinic, Monoclinic, Orthorhombic, Tetragonal, Trigonal/Hexagonal, Hexagonal/Hexagonal, Cubic} |

TABLE 6

RodGroups

| Parameter | Type | Value |
|---|---|---|
| Lattice | Enumerated | member of set: {None/Any, Triclinic, Monoclinic/Inclined, Monoclinic/Orthogonal, Orthorhombic, Tetragonal, Trigonal, Hexagonal} |

TABLE 7

LayerGroups

| Parameter | Type | Value |
|---|---|---|
| Lattice | Enumerated | member of set: {None/Any, Triclinic/Oblique, Monoclinic/Oblique, Monoclinic/Rectangular, Orthorhombic/Rectangular, Tetragonal/Square, Trigonal/Hexagonal, Hexagonal/Hexagonal } |

TABLE 8

SpaceGroups

| Parameter | Type | Value |
|---|---|---|
| Lattice | Enumerated | member of set: {None/Any, Triclinic, Monoclinic/Primitive, Monoclinic/CFaceCentered, Orthorhombic/Primitive, |

TABLE 8-continued

SpaceGroups

| Parameter | Type | Value |
|---|---|---|
| | | Orthorhombic/CFaceCentered, Orthorhombic/BodyCentered, Orthorhombic/FaceCentered, Tetragonal/Primitive, Tetragonal/BodyCentered, Cubic/Primitive, Cubic/BodyCentered, Cubic/FaceCentered, Trigonal, Trigonal/Hexagonal, Hexagonal/Hexagonal } |

TABLE 9

Default values recommended for when not specified for the indicated SymmetryGroupCategory. Any default value is acceptable however.

| Parameter | Type | Value |
|---|---|---|
| aInstances | Integer | aInstances == 1 |
| bInstances | Integer | bInstances == 1 |
| cInstances | Integer | cInstances == 1 |
| aDirection | Enumerated | positive |
| bDirection | Enumerated | positive |
| cDirection | Enumerated | positive |

TABLE 10

PointGroups_0D

No Further Parameters

TABLE 11

**PointGroups_1D
LineGroups**

| Parameter | Type | Value |
|---|---|---|
| aInstances | Integer | aInstances > 0 |
| aDirection | Enumerated | member of set: { positive, negative, centered } |

TABLE 12

**PointGroups_2D
FriezeGroups
PlaneGroups**

| Parameter | Type | Value |
|---|---|---|
| aInstances | Integer | aInstances > 0 |
| bInstances | Integer | bInstances > 0 |
| aDirection | Enumerated | member of set: { positive, negative, centered } |
| bDirection | Enumerated | member of set: { positive, negative, centered } |

TABLE 13

PointGroups_3D
RodGroups
LayerGroups
SpaceGroups

| Parameter | Type | Value |
|---|---|---|
| aInstances | Integer | aInstances > 0 |
| bInstances | Integer | bInstances > 0 |
| cInstances | Integer | cInstances > 0 |
| aDirection | Enumerated | member of set: { positive, negative, centered } |
| bDirection | Enumerated | member of set: { positive, negative, centered } |
| cDirection | Enumerated | member of set: { positive, negative, centered } | iii) Selection of Unit Cell parameters for selected symmetry group category or Lattice. The prior selection of a Lattice is necessary if one wishes to constrain the choices for the angular dimensions of the Unit Cell to choices that are valid for the Lattice.
psuedocode:
CrystalSym.UI.getUnitCellParameters
(symmetryGroupCategory, lattice, parameterName)
a) Suggested Default Values for Unit Cell Dimensions if not specified in Tables 15-18

| | | |
|---|---|---|
| alphaAngle | Real (floating point) | alphaAngle == 90.0 |
| betaAngle | Real (floating point) | betaAngle == 90.0 |
| gammaAngle | Real (floating point) | gammaAngle == 90.0 |
| aVectorMagnitude | Real (floating point) | aVectorMagnitude == 1.0 |
| bVectorMagnitude | Real (floating point) | bVectorMagnitude == 1.0 |
| cVectorMagnitude | Real (floating point) | cVectorMagnitude == 1.0 | b) Alternatively, default magnitude values based upon the size of the selected object may be more appropriate. Usually the magnitudes of the UnitCell vectors a, b and c would be in a similar size range to the size of the selected object(s). However any values within the capabilities of the host system to handle are acceptable in terms of the process itself.

c) In the situations where the values are not specified (because they are not within the dimensions of the space), the values would not affect the building of the Unit Cell, but could affect the Lattice, should it be built in the direction of a vector which is not a part of the default space of the Unit Cell.

TABLE 14

For all SymmetryGroupCategory values
(these parameters would usually be assumed)

| Parameter | Type | Value |
|---|---|---|
| Origin | 3D Point | The origin of the UnitCell. The aVector, bVector and cVector which intersect the Origin are the axes which form the coordinate system of the UnitCell. The Origin is the SymmetryPoint for PointGroups_1D, PointGroups_2D and PointGroups_3D. |
| aVectorDirection | 3D Vector | The aVectorDirection and |
| bVectorDirection | 3D Vector | bVectorDirection which intersect the Origin |

TABLE 14-continued

For all SymmetryGroupCategory values
(these parameters would usually be assumed)

| Parameter | Type | Value |
|---|---|---|
| cVectorDirection | 3D Vector | together define the SymmetryPlane for PlaneGroups and LayerGroups. The cVectorDirection through the Origin is the SymmetryLine for LineGroups, FriezeGroups and RodGroups. |

TABLE 15

PointGroups_1D
PointGroups_2D
PointGroups_3D

| Parameter | Type | Value |
|---|---|---|
| SymmetryPoint | 3D point | The host system may determine the best way to specify a point. |

There are no UnitCell Dimensions for PointGroups_1D, PointGroups_2D and PointGroups_3D.
Alternatively:
For Pointgroups_1D, one could implement the one LineGroups UnitCell Dimension. For PointGroups_2D, one could implement the three PlaneGroups UnitCell Dimensions. For PointGroups_3D, one could implement the six SpaceGroups UnitCell Dimensions.

TABLE 16

LineGroups
FriezeGroups
RodGroups

| Parameter | Type | Value |
|---|---|---|
| SymmetryLine | 3D line | The host system may determine the best way to specify a line. |

There is one UnitCell Dimension for LineGroups, FriezeGroups and RodGroups.
aVectorMagnitude Real (floating point) a_Magnitude > 0.0
Alternatively:
For FriezeGroups, one could implement the three PlaneGroups UnitCell Dimensions. For RodGroups, one could implement the six SpaceGroups UnitCell Dimensions.

TABLE 17

PlaneGroups
LayerGroups

| Parameter | Type | Value |
|---|---|---|
| SymmetryPlane | 3D plane | The host system may determine the best way to specify a plane. |

There are three UnitCell Dimensions for PlaneGroups and LayerGroups.
vectors a and b, and the angle between them gamma

| | | |
|---|---|---|
| aVectorMagnitude | Real (floating point) | aVectorMagnitude > 0.0 with Lattice conditions below |
| bVectorMagnitude | Real (floating point) | bVectorMagnitude > 0.0 with Lattice conditions below |
| gammaAngle | Real (floating point) | depends upon Lattice |

| Lattice | Value |
|---|---|
| None/Any | No Conditions |
| Oblique | 0.0 < gamma_angle < 180.0 |
| Rectangular | gamma_angle = 90.0 |
| Square | gamma_angle = 90.0 |

TABLE 17-continued

| | PlaneGroups LayerGroups | |
|---|---|---|
| | Hexagonal | aVectorMagnitude == bVectorMagnitude gamma_angle = 120.0 aVectorMagnitude == bVectorMagnitude |

Alternatively:
For LayerGroups, one could implement the six SpaceGroups UnitCell Dimensions.

TABLE 18

SpaceGroups

| Parameter | Type | Value |
|---|---|---|
| SymmetrySpace | 3D space | Usually it is assumed. It is possible that a host system may have more than one space being modeled. It would then have a way of specifying the space. |

There are six UnitCell dimensions for SpaceGroups.
vectors a, b, c and the angles between them alpha, beta, gamma
alpha is the angle between vectors b and c
beta is the angle between vectors c and a
gamma is the angle between vectors a and b

| Parameter | Type | Value |
|---|---|---|
| aVectorMagnitude | Real (floating point) | aVectorMagnitude > 0.0 with Lattice conditions below |
| bVectorMagnitude | Real (floating point) | bVectorMagnitude > 0.0 with Lattice conditions below |
| cVectorMagnitude | Real (floating point) | cVectorMagnitude > 0.0 with Lattice conditions below |
| alphaAngle | Real (floating point) | depends upon Lattice |
| betaAngle | Real (floating point) | depends upon Lattice |
| gammaAngle | Real (floating point) | depends upon Lattice |

| | Lattice | Values |
|---|---|---|
| | None/Any, Triclinic | 0.0 < alpha_angle < 180.0 0.0 < beta_angle < 180.0 0.0 < gamma_angle < 180.0 |
| | Monoclinic/Inclined, Monoclinic/Rectangular | 0.0 < alpha_angle < 180.0 beta_angle = 90.0 gamma_angle = 90.0 |
| | Monoclinic/Orthogonal, Monoclinic/Oblique, Monoclinic/Primitive | alpha_angle = 90.0 beta_angle = 90.0 0.0 < gamma_angle < 180.0 |
| | Monoclinic/CFaceCentered | alpha_angle = 90.0 0.0 < beta_angle < 180.0 gamma_angle = 90.0 |
| | Orthorhombic, Tetragonal, Cubic | alpha_angle = 90.0 beta_angle = 90.0 gamma_angle = 90.0 |
| | Tetragonal | aVectorMagnitude == bVectorMagnitude |
| | Cubic | aVectorMagnitude == bVectorMagnitude == cVectorMagnitude |
| | Trigonal | alpha_angle < 120.0 beta_angle < 120.0 gamma_angle < 120.0 aVectorMagnitude == bVectorMagnitude == cVectorMagnitude |
| | Hexagonal | alpha_angle = 90.0 beta_angle = 90.0 gamma_angle = 120.0 aVectorMagnitude == bVectorMagnitude | iv) Selection of Symmetry Group and/or Relationships Psuedocode:
 CrystalSym.UI.getSymmetryGroupParameters
 (symmetryGroupCategory, lattice, parameterName)
 a) Each symmetry group may be specified by Number or by Name. In addition to the crystallographic groups, there are an infinite number of two dimensional non-crystallographic symmetric groups which can be created by setting the values of the rotation axis ==5 or >=7. These symmetry groups are not space filling groups. They therefore have no Lattice implied by their symmetry. These groups are implemented within the PointGroups_2D category.
 b) The CrystalSym process allows the use of any Lattice one desires to distribute created UnitCells, regardless of the Lattice implied by the UnitCell symmetry. Requiring the use of a Lattice specific to the UnitCell would be a partial implementation of the CrystalSym process.
 c) There are more than one set of names in the literature for each symmetryGroupCategory. I have only specified one set of names for each symmetryGroupCategory. Any set of names which describes the same set of groups can be used.

d) Names enumerated for and details of the LineGroups, PointGroups_2D, PointGroups_3D, PlaneGroups and SpaceGroups can be found in International Tables for Crystallography, Vol. A. Space-Group Symmetry Edited by Theo Hahn e) Names enumerated for and details of the FriezeGroups, RodGroups and LayerGroups are from International Tables for Crystallography, Vol. E. Subperiodic Groups Edited by Dr. Vojtech Kopsky and Dr. Daniel B. Litvin g) Because the data for the groups is stored within ASCII files, which does not permit for overscore and subscripts as specified in the names in the sources cited here, the following conventions were used in the names: 1) a "-" before a symbol is the same as an overscore, 2) subscripts are indicated by use of parenthesis around the symbol.

TABLE 19

PointGroups_0D

| Parameter | Type | Value |
| --- | --- | --- |
| SymmetryNumber | Integer | 0 |
| SymmetryName | Enumerated | 0 |

TABLE 20

PointGroups_1D

| Parameter | Type | Value |
| --- | --- | --- |
| SymmetryNumber | Integer | 0 < SymmetryNumber <= 2 |
| SymmetryName | Enumerated | member of set: { 1, m } |

TABLE 21

LineGroups

| Parameter | Type | Value |
| --- | --- | --- |
| SymmetryNumber | Integer | 0 < SymmetryNumber <= 2 |
| SymmetryName | Enumerated | member of set: { 11, 1m } |

TABLE 22

PointGroups_2D

| Parameter | Type | Value |
| --- | --- | --- |
| SymmetryNumber | Integer | 0 < SymmetryNumber <= 10 |
| SymmetryName | Enumerated | Member of set depending upon |
| | Lattice | Value Sets |
| | Oblique | { 1, 2 } |
| | Rectangular | { m, 2m } |
| | Square | { 4, 4m } |
| | Hexagonal | { 3, 3m, 6, 6m } |
| | None/Any | { X, Xm } where X is an integer > 0 |

TABLE 23

FriezeGroups

| Parameter | Type | Value |
| --- | --- | --- |
| SymmetryNumber | Integer | 0 < SymmetryNumber <= 7 |
| SymmetryName | Enumerated | Member of set depending upon |
| | Lattice | Value Sets |
| | Oblique | { p1, p211 } |
| | Rectangular | { p1m1, p11m, p11g, p2mm, p2mg } |

TABLE 24

PlaneGroups

| Parameter | Type | Value |
| --- | --- | --- |
| SymmetryNumber | Integer | 0 < SymmetryNumber <= 17 |
| SymmetryName | Enumerated | Member of set depending upon |
| | Lattice | Value Sets |
| | Oblique | { p1, p2 } |
| | Rectangular/Primitive | { pm, pg, pmm, pmg, pgg } |
| | Rectangular/Centered | { cm, cmm } |
| | Square | { p4, p4m, p4g } |
| | Hexagonal | { p3, p3m1, p31m, p6, p6m } |

TABLE 25

PointGroups_3D

| Parameter | Type | Value |
| --- | --- | --- |
| SymmetryNumber | Integer | 0 < SymmetryNumber <= 32 |
| SymmetryName | Enumerated | Member of set depending upon |
| | Lattice | Possible Name Values |
| | Triclinic | { 1, −1 } |
| | Monoclinic | { 2, m, 2/m } |
| | Orthorhombic | { 222, mm2, mmm } |
| | Tetragonal | { 4, −4, 4/m, 422, 4mm, −42m, 4/mmm } |
| | Trigonal | { 3, −3, 32, 3m, −3m } |
| | Hexagonal | { 6, −6, 6/m, 622, 6mm, −6m2, 6/mmm } |
| | Cubic | { P23, Pm3, P432, P-43m, Pm3m } |

TABLE 26

RodGroups

| Parameter | Type | Value |
| --- | --- | --- |
| SymmetryNumber | Integer | 0 < SymmetryNumber < 75 |
| SymmetryName | Enumerated | member of set depending upon |
| | Lattice | ValueSets |
| | Triclinic | { p1, p-1 } |
| | Monoclinic/Inclined | { p2, pm, pc, p2/m, p2/c } |

TABLE 26-continued

| RodGroups | |
|---|---|
| Monoclinic/ Orthogonal | { p112, p112(1), p11m, p112/m, p112(1)/m } |
| Orthorhombic | { p222, p222(1), pmm2, pcc2, pmc2(1), p2mm, p2cm, pmmm, pccm, pmcm } |
| Tetragonal | { p4, p4(1), p4(2), p4(3), p-4, p4/m, p4(2)/m, p422, p4(1)22, p4(2)22, p4(3)22, p4mm, p4(2)cm, p4cc, p-42m, p-42c, p4/mmm, p4/mcc, p4(2)/mmc } |
| Trigonal/ Hexagonal | { p3, p3(1), p3(2), p-3, p312, p3(1)12, p3(2)12, p3m1, p3c1, p-31m, p-31c } |
| Hexagonal/ Hexagonal | { p6, p6(1), p6(2), p6(3), p6(4), p6(5), p-6, p6/m, p6(3)/m, p622, p6(1)22, p6(2)22, p6(3)22, p6(4)22, p6(5)22, p6mm, p6cc, p6(3)mc, p-6m2, p-6c2, p6/mmm, p6/mcc, p6/mmc } |

TABLE 27

| LayerGroups | | |
|---|---|---|
| Parameter | Type | Value |
| SymmetryNumber | Integer | 0 < SymmetryNumber < 80 |
| SymmetryName | Enumerated | member of set depending upon |
| | Lattice | Value Sets |
| | Triclinic | { p1, p-1 } |
| | Monoclinic/ Oblique | { p112, p11m, p11a, p112/m, p112/a } |
| | Monoclinic/ Rectangular | { p211, p2(1)11, c211, pm11, pb11, cm11, p2/m11, p2(1)/m11, p2/b11, p2(1)/b11, c2/m11 } |
| | Orthorhombic/ Rectangular | { p222, p2(1)22, p2(1)2(1)2, c222, pmm2, pma2, pba2, cmm2, pm2m, pm2(1)b, pb2(1)m, pb2b, pm2a, pm2(1)n, pb2(1)a, pb2n, cm2m, cm2e, pmmm, pmaa, pban, pmam, pmma, pman, pbaa, pbam, pbma, pmmn, cmmm, cmme } |
| | Tetragonal/ Square | { p4, p-4, p4/m, p4/n, p422, p42(1)2, p4mm, p4bm, p-42m, p-42(1)m, p-4m2, p-4b2, p4/mmm, p4/nbm, p4/mbm, p4/nm } |
| | Trigonal/ Hexagonal | { p3, p-3, p312, p321, p3m1, p31m, p-31m, p-3m1 } |
| | Hexagonal/ Hexagonal | { p6, p-6, p6/m, p622, p6mm, p-6m2, p-62m, p6/mmm } |

TABLE 28

| SpaceGroups | | |
|---|---|---|
| Parameter | Type | Value |
| SymmetryNumber | Integer | 0 < SymmetryNumber < 230 |
| SymmetryName | Enumerated | member of set depending upon |
| | Lattice | Value Sets |
| | Triclinic | { P1, P-1 } |
| | Monoclinic/Primitive | { P2, P2(1), Pm, Pc, P2/m, P2(1)/m, P2/c, P2(1)/c } |
| | Monoclinic/CFaceCentered | { C2, Cm, Cc, C2/m, C2/c } |
| | Orthorhombic/Primitive | { P222, P222(1), P2(1)2(1)2, P2(1)2(1)2(1), Pmm2, Pmc2(1), Pcc2, Pma2, Pca2(1), Pnc2, Pmn2(1), Pba2, Pna2(1), Pnn2, Pmmm, Pnnn, Pccm, Pban, Pmma, Pnna, Pmna, Pcca, Pbam, Pccn, Pbcm, Pnnm, Pmmn, Pbcn, Pbca, Pnma } |
| | Orthorhombic/CFaceCentered | { C222(1), C222, Cmm2, Cmc2(1), Ccc2, Amm2, Abm2, Ama2, Aba2, Cmcm, Cmca, Cmmm, Cccm, Cmma, Ccca } |
| | Orthorhombic/BodyCentered | { I222, I2(1)2(1)2(1), Imm2, Iba2, Ima2, Imm, Ibam, Ibca, Imma } |
| | Orthorhombic/FaceCentered | { F222, Fmm2, Fdd2, Fmmm, Fddd } |
| | Tetragonal/Primitive | { P4, P4(1), P4(2), P4(3), P-4, P4/m, P4(2)/m, P4/n, P4(2)/n, P422, P42(1)2, P4(1)22, P4(1)2(1)2, P4(2)22, P4(2)2(1)2, P4(3)22, P4(3)2(1)2, P4mm, P4bm, P4(2)cm, P4(2)nm, P4cc, P4nc, P4(2)mc, P4(2)bc, P-42m, P-42c, P-42(1)m, P-42(1)c, P-4m2, P-4c2, P-4b2, P-4n2, P4/mmm, P4/mcc, P4/nbm, P4/nnc, P4/mbm, P4/mnc, P4/nmm, P4/ncc, P4(2)/mmc, |

TABLE 28-continued

| SpaceGroups | | |
|---|---|---|
| | | P4(2)/mcm, P4(2)/nbc, P4(2)/nnm, P4(2)/mbc, P4(2)/mnm, P4(2)/nmc, P4(2)/ncm } |
| Tetragonal/BodyCentered | { | I4, I4(1), I-4, I4/m, I4(1)/a, I422, I4(1)22, I4mm, I4cm, I4(1)md, I4(1)cd, I-4m2, I-4c2, I-42m, I-42d, I4/mmm, I4/mcm, I4(1)/amd, I4(1)/acd} |
| Cubic/Primitive | { | P23, P2(1)3, Pm-3, Pn-3, Pa-3, P432, P4(2)32, P4(3)32, P4(1)32, P-43m, P-43n, Pm-3m, Pn-3n, Pm-3n, Pn-3m } |
| Cubic/BodyCentered | { | I23, I2(1)3, Im-3, Ia-3, I432, I4(1)32, I-43m, I-43d, Im-3m, Ia-3d } |
| Cubic/FaceCentered | { | F23, Fm-3, Fd-3, F432, F4(1)32, F-43m, F-43c, Fm-3m, Fm-3c, Fd-3m, Fd-3c } |
| Trigonal | { | R3, R-3, R32, R3m, R3c, R-3m, R-3c } |
| Trigonal/Hexagonal | { | P3, P3(1), P3(2), P-3, P312, P321, P3(1)12, P3(1)21, P3(2)12, P3(2)21, P3m1, P31m, P3c1, P31c, P-31m, P-31c, P-3m1, P-3c1 } |
| Hexagonal/Hexagonal | { | P6, P6(1), P6(5), P6(2), P6(4), P6(3), P-6, P6/m, P6(3)/m, P622, P6(1)22, P6(5)22, P6(2)22, P6(4)22, P6(3)22, P6mm, P6cc, P6(3)cm, P6(3)mc, P-6m2, P-6c2, P-62m, P-62c, P6/mmm, P6/mcc, P6(3)/mcm, P6(3)/mmc } |

VI. Specification of the CrystalSym Process

Creation of a Lattice of UnitCells within the Host System's virtual space. The UnitCell consists of instances of the user selected virtual object(s) each instance having been transformed according to the user selected symmetry group and UnitCell parameters.

The Lattice consists of instances of the created UnitCells, each instance having been transformed according to the selected Lattice parameters.

In systems which implement 3D virtual space, objects are often created in a graph structure. Our graph structure is:

A) The AsymetricUnit will have as parents, AsymetricUnit instances.
B) The AsymetricUnit instances have as their parent the UnitCell object.
C) The Unit Cell object will have as parents, UnitCell instances.
D) The UnitCell instances will have as their parent the Lattice object.

If the Host System does not implement graph structure for its objects, then it may be necessary to implement the process using copies of the selected object (s) rather than references. The implementer may wish to keep track of the graph relationship information in this case, in order to maintain object relationships when objects are moved within the host system subsequent to their creation.

If the host system does not allow objects to be grouped, then the implementation will need to handle the grouping of objects. This process description assumes that objects can be grouped within the host system.

One may need to query and store the current location of the selected object(s) within the graph structure in order to insert the Lattice of UnitCells which gets created into the correct location within that structure. One can also create the Lattice outside of the current object hierarchy. This will depend upon the needs of the implementation.

Following is an outline of the basic steps of the process:
A) Ensure that the CrystalSym process is initialized.
B) Initialize values from specified parameters. (See Chapter IV.)
C) Initialize values from selected object(s).
D) Group the selected objects. This is called the AsymetricUnit.
E) Create object reference nodes (AsymetricUnit instances) with the requested symmetry operation transformations, pointing them to (making them parents of) the AsymetricUnit.
F) Create a UnitCell object as a group of the AsymetricUnit instances.
G) [optional] Create an object to show the bounding box of the UnitCell and add the bounding box object as a child of the UnitCell.
H) [optional] Add parameter values to the UnitCell object.
I) Create object reference nodes (UnitCell instances) with the requested Lattice transformations, pointing them to (making them parents of) the UnitCell.
J) Create a Lattice as a group of the UnitCell instances.

The above process description builds the Lattice from the bottom up, ie: first makes the AsymetricUnit instances to build the UnitCell, then makes the UnitCell instances to build the Lattice. The order in which the steps appear is influenced by the capabilities of the most recent host system within which I implemented the CrystalSym process. Several of the steps could be done in a different order. It is also possible to implement the process in the reverse order. Which order is best may depend upon the Host System.

One possible reverse ordering of the steps follows:

A), B) and C) are the same as above.

D) Create in the host system an object which will be the Lattice.

E) Add as children to the Lattice object, object reference nodes (UnitCell instances), with the desired transformations.

F) Create a UnitCell object and point the UnitCell instances to it (make them parents of it).

G) [optional] Add parameter values to the UnitCell object.

H) [optional] Create an object to show the bounding box of the UnitCell and add the bounding box object as a child of the UnitCell.

I) Add as children to the UnitCell object,
object reference nodes (AsymetricUnit instances)
with the desired transformations.

J) Create an AsymmetricUnit object as a grouping of the selected object(s).

K) Point the AsymetricUnit instances to the AsymmetricUnit object
(make them parents of it).

Note that the below pseudo-code might sometimes look like C++ but it is not code. The implementer of the process will need to decide in which language to implement the CrystalSym process, declare types and variables, objects and methods, etc. in order to implement the process. This pseudo-code simply details the logic of the process. Any process which substantially follows the logic detailed herein would be considered an implementation of the CrystalSym process.

Comments are preceded by "/*" and ended with "*/". Logical steps of the process are the sections which are not enclosed by comment markers.

Any section of the logic which is [optional] to the process will be preceded by [begin optional section] and ended by [end optional section]

---

Detail of the CrystalSym Process
pseudo-code:
CrystalSym.createLatticeOfUnitCells ( )
{
    [begin optional section]
    /*

---

A) Ensure that the CrystalSym process is initialized.
That is, ensure that access to the matrix data for the operations is available to the process. This step is optional only in the sense that if you don't do it then your process may not work if the data is not available.
*/
If (the CrystalSym process is not initialized)
{
    CrystalSym.initSymmetryGroups( );
    CrystalSym.setupErrorHandlers( );
    /* Do anything else you need to do to initialize your
    particular implementation of the process. */
}
[end optional section]
/*

---

B) Initialize values from selected parameters.
  i) In this pseudo-code we will be directly using parameters from Chapter V. This information may be directly accessible or it may be necessary to query the user interface (as implied by the pseudo-code fragments at the beginning of each of the parameter sections in Chapter V. In that case queries could happen at this point in the process in order to gather the information into accessible variables.

[begin optional section]

ii) This section can also verify that the parameters are all within the constraints necessary to get valid results (ie: no divisions by zero and that sort of thing). That could also be done within the parameter interface when the parameters (see Chapter V).

iii) If the values are within the constraints listed in the parameter section (see Chapter V), then that is a first step. There are, however some other values within the mathematics which produce invalid results. It would be good to have ErrorHandlers created to deal with these potential mathematical exceptions.

---

```
*/
symmetryGroupCategory =
    CrystalSym.UI.getSymmetryGroupCategory( );
for (each Lattice parameterName needed)
{
    lattice.parameterName
        = CrystalSym.UI.getLatticeParameters
            (symmetryGroupCategory, parameterName);
}
for (each UnitCell parameterName needed)
{
    unitCell.parameterName
        = CrystalSym.UI.getUnitCellParameters
            (symmetryGroupCategory, lattice, parameterName);
}
SymmetryNumber
    = CrystalSym.UI.getSymmetryGroupParameters
        (symmetryGroupCategory, lattice, "SymmetryNumber");
    SymmetryName
        CrystalSym.UI.getSymmetryGroupParameters
            (symmetryGroupCategory, lattice, "SymmetryName");
[end optional section]
/*
```

---

C) Initialize values from selected object(s).

It is an optional step, if you have direct access to the selected object(s) and there is one. Not checking whether there is actually a selected object, just makes your process less robust. */

---

```
object = HostSystem.selectedObject( );
[begin optional section]
if (there is no selected object)
    CrystalSym.handleTheError( "No Object Selected" );
else if (object is a previously created UnitCell)
{
    /* That is, object is a single selected object and it is a
    unitCell object created via a previous invocation of the
    CrystalSym process */
    if (the user wishes to have the UnitCell parameters be set
        according to those that are stored within object)
    {
        /* Set parameters from this previously created object.
        This is an optional feature of the CrystalSym process.
        This overrides some of the parameters set in step B) */
        CrystalSym.UI.setUnitCellParametersFrom(object);
    }
}
[end optional section]
/*
```

---

D) Group the selected object(s). This is called the AsymetricUnit. Create and initialize the asymetricUnit.
  i) Generate a unique name or handle for the asymetricUnit ii) Create the asymmetric unit as a grouping of the selected object (s) This is assumed to mean that the asymmetricUnit becomes the parent of the selected object(s). It might be important in some host systems to keep track of the original parent of the selected object(s) in order, if desired, to place the Lattice when it is created in the same location of the graph.

```
*/
    asymetricUnit.object
        = HostSystem.group(object, CrystalSym.createUniqueNaine( ));
/*
```

E) Create object reference nodes (AsymetricUnit instances) with the requested symmetry operation transformations, pointing them to (making them parents of) the AsymetricUnit.
i) Get the symmetry group operations for the requested symmetry group. Basically this is checking to make sure that a valid operation is specified and that it is accessible to the CrystalSym process. The details of how this is done may vary from implementation to implementation

```
*/
if (SymmetryNumber is valid)
    /* get the symmetryOpList corresponding to SymmetryNumber */
    symmetryOpList = CrystalSym.getSymmetryOperationsFor
        (SymmetryGroupCategory, SymmetryNumber );
else if (SymmetryName is specified )
    /* get the symmetryOpList corresponding to SymmetryName */
    symmetryOpList = CrystalSym.getSymmetryOperationsFor
        (SymmetryGroupCategory, SymmetryName );
if (no symmetryOpList was found)
    CrystalSym.handleTheError("Invalid or No Symmetry Operation");
/*
``` ii) create an instance for each operation in the group */
for (each operation (currentOperation) in symmetryOpList)

```
{
    /*
    a) create the object instance for this operation.
        Depending upon how the host system implements object
    instancing, it may be that the implementation will want to use
    the AsymetricUnit as the first object instance, then create
    references to that first object for subsequent instances. That
    can work assuming that the first matrix is the identity matrix,
    as it always is in the files accompanying this specification.
    It may also depend upon how graph structure is implemented within
    the host system.
        This description of the process creates a graph
    where each instance, including the first one, is a parent of the
    asymmetric unit. That is they point to the asymmetric unit as
    their object description.
    */
    asymmetricUnitInstance = HostSystem.createObjectInstance
        (asymmetricUnit, CrystalSym.createuniqueName( ));
    /*
    b) place the newObject instance above the asymmetricUnit
    in the HostSystem object graph. This might be done by the
    HostSystem when the object is created in part a)
    */
    HostSystem.addParent
        (asymmetricUnit, asymmetricUnitInstance);
    /*
    c) create the transform matrix for this operation */
```

-continued

```
/* get the UnitCell Matrix [M] for the current operation */
M = CrystalSym.List.getObjectAtIndex
    (symmetryOpList, currentOperation);
```

/* Create the [C2U] and [U2C] matrices.
See Equation 2, Equation 3 and Equation 4 in Chapter IV, Specification of Symmetry Operations and Files. The following parameters are needed for the creation of the [C2U] and [U2C] matrices. They are listed with the symbols which correspond to each parameter in the Equations:

TABLE 29

| Parameter | Name in Equations |
|---|---|
| aVectorMagnitude | a |
| bVectorMagnitude | b |
| cVectorMagnitude | c |
| alphaAngle | α |
| betaAngle | β |
| gammaAngle | γ |

```
*/
C2U = CrystalSym.Matrix.createC2U(
    aVectorMagnitude, bVectorMagnitude,
    cVectorMagnitude, alphaAngle,
    betaAngle, gammaAngle);
U2C = CrystalSym.Matrix.createU2C(
    aVectorMagnitude, bVectorMagnitude,
    cVectorMagnitude, alphaAngle,
    betaAngle, gammaAngle);
operationMatrix = CrystalSym.Matrix.combine(C2U, M, U2C);
/*
d) Set the Matrix and/or transformation values for the
instance
*/
if (the host system allows
    direct setting of transformation matrix)
{
    HostSystem.setTransformMatrix
        (asymmetricUnitInstance, operationMatrix);
}
else
{
    HostSystem.setScale
        (asymmetricUnitInstance,
        CrystalSym.Matrix.scaleValues
            (operationMatrix));
        HostSystem.setRotation
            (asymmetricUnitInstance,
            CrystalSym.Matrix.rotationValues
                (operationMatrix));
        HostSystem.setTranslation
            (asymmetricUnitInstance,
            CrystalSym.Matrix.translationValues
                (operationMatrix));
}
/*
e) add the instance to a list or in some other way keep
track of the instances that this loop is creating)
*/
CrystalSym.List.add
    (asymUnitInstanceList, asymmetricUnitInstance);
} /* End of Section E)ii) All asymmetricUnitInstances are created */
/*
```

F) Create a UnitCell object as a group of the AsymetricUnit instances.
   i) Generate a unique name or handle for the unitCell.
   ii) Group the asymUnitInstanceList to create the unitCell. It is assumed that this will cause the asymmetricUnitInstances to be children of the UnitCell.
   [begin optional section]
   iii) The location and orientation of the created UnitCell will be left at the Cartesian origin with the a-axis of the UnitCell aligned with the Cartesian x-axis. After the Lattice is constructed, it will be moved and oriented to correspond with the specified UnitCell Origin and the aVectorDirection, bVectorDirection and cVectorDirection.
   iv) If one was only implementing the UnitCell aspect of the process, you could orient and place the UnitCell object according to the same algorithm as will be used to place the Lattice.

```
[end optional section]
*/
unitCell = HostSystem.group
    (asymUnitInstanceList, CrystalSym.createUniqueName( ));
[begin optional section]
/*
```

G) [optional] Create an object to show the bounding box of the UnitCell and add the bounding box object as a child of the UnitCell.

```
/*
i) Create a unit cube object within the host system.
*/
unitCube = HostSystem.createCube(0.0, 0.0, 0.0, 1.0, 1.0, 1.0);
/*
ii) Transform each vertex of the cube by multiplying it through
(dot product with) the [U2C] matrix.
*/
unitCube.vertex1
    = CrystalSym.Matrix.dotProduct(U2C, unitCube.vertex1);
unitCube.vertex2
    = CrystalSym.Matrix.dotProduct(U2C, unitCube.vertex2);
unitCube.vertex3
    = CrystalSym.Matrix.dotProduct(U2C, unitCube.vertex3);
unitCube.vertex4
    = CrystalSym.Matrix.dotProduct(U2C, unitCube.vertex4);
unitCube.vertex5
    = CrystalSym.Matrix.dotProduct(U2C, unitCube.vertex5);
unitCube.vertex6
    = CrystalSym.Matrix.dotProduct(U2C, unitCube.vertex6);
/*
iii) Place the unit cube into the object graph as a child of the
UnitCell.
*/
HostSystem.setParent(unitCube, unitCell);
[end optional section]
[begin optional section]
/*
```

H) [optional] Add parameter values to the UnitCell object. That is, add parameters to the unitCell object within the host system. This option allows the ability to initialize parameters from previously created objects.

```
*/
*/
i) Add unitCell dimension parameters
*/
HostSystem.addParameter(unitCell, "a", double);
HostSystem.addParameter(unitCell, "b", double);
HostSystem.addParameter(unitCell, "c", double);
HostSystem.addParameter(unitCell, "alpha", double);
HostSystem.addParameter(unitCell, "beta", double);
HostSystem.addParameter(unitCell, "gamma", double);
/*
ii) Add group category parameter.
For GROUPCATEGORYTYPES see Chapter V. They are all the
enumerated values which are listed. It could just be a string type
or it could be implemented as integers, etc.
*/
HostSystem.addParameter
    (unitCell, "GroupCategory", GROUPCATEGORYTYPES);
/*
iii) Add lattice parameters.
LATTICETYPES are the enumerated lattice values valid
for the selected groupCategory.
*/
HostSystem.addParameter(unitCell, "Lattice", LATTICETYPES);
/*
iv) Set the values of the added parameters.
*/
HostSystem.setParameter(unitCell, "a", aVectorMagnitude);
HostSystem.setParameter(unitCell, "b", bVectorMagnitude);
HostSystem.setParameter(unitCell, "c", cVectorMagnitude);
HostSystem.setParameter(unitCell, "alpha", alphaAngle);
HostSystem.setParameter(unitCell, "beta", betaAngle);
HostSystem.setParameter(unitCell, "gamma", gammaAngle);
HostSystem.setParameter(unitCell, "Lattice", lattice);
HostSystem.setParameter(unitCell, "GroupCategory",
    SymmetryGroupCategory);
[end optional section]
/*
```

I) Create object reference nodes (UnitCell instances) with the requested Lattice transformations, pointing them to (making them parents of) the UnitCell.

```
/* for each row of the lattice */
for ( i=0; i<aInstances; i++)
{
    /* for each column of the lattice */
    for ( j=0; j<bInstances; j++)
    {
        /* for each layer of the lattice */
        for ( k=0; k<cInstances; k++)
        {
            /*
            i) Create an instance of the unit cell.
            */
            unitCellInstance =
                HostSystem.createObjectInstance
                (unitCell, CrystalSym.createUniqueName( ));
            /*
            ii) place the unitCellInstance above the
            unitCell in the HostSystem object graph. This might
            be done by the HostSystem when the object is created
            in part i)
            */
            HostSystem.addParent
                (unitCell, unitCellInstance);
            /*
            iii) Create a matrix which will translate
            the unitCellInstance to the correct location.
            */
            transformMatrix =
                CrystalSym.Matrix.createTranslationMatrix
                    (k, j, i) ;
            finalMatrix
                CrystalSym.Matrix.combine
                    (C2U, transformMatrix, U2C);
            /*
            iv) Set the unitCellInstance transform matrix.
```

-continued

```
    */
    if (the host system allows direct setting of
            transformation matrix)
    {
        HostSystem.setTransformMatrix
            (unitCellInstance, finalMatrix);
    }
    else
    {
        HostSystem.setScale
            (unitCellInstance,
            CrystalSym.Matrix.scaleValues
                (finalMatrix));
        HostSystem.setRotation
            (unitCellInstance,
            CrystalSym.Matrix.rotationValues
                (finalMatrix));
        HostSystem.setTranslation
            (unitCellInstance,
            CrystalSym.Matrix.translationValues
                (finalMatrix));
    }
    /*
    v) add the instance to a list or in some other
    way keep track of the instances that this loop
    is creating)
    */
    CrystalSym.List.add
            (unitCellInstanceList, unitCellInstance);
    /* end of layer loop */
    /* end of column loop */
/* end of row loop */
/*
```

J) Create a Lattice as a group of the UnitCell instances.
  i) Generate a unique name or handle for the Lattice.
  ii) Group the unitCellInstanceList to create the Lattice. It is assumed that this will cause the unitCellInstances to be children of the Lattice.

```
*/
latticeObject = HostSystem.group
    (unitCellInstanceList, CrystalSym.createUniqueName( ));
[begin optional section]
/*
iii) determine the location of the lattice */
/* In this algorithm there are four choices,
negative locates the lattice on the negative side
    of the origin of the axis
positive locates the lattice on the positive side
    of the origin of the axis
centered locates the lattice such that the origin of the axis is
    centered within the lattice.
```

This description of the process sets the start location for each axis and builds the lattice in the positive direction along each axis. This specific algorithm is not essential within the CrystalSym process. Any implementation of the process will however make some assumptions or allow specification of some sort of parameters to determine where the lattice is located when it is created.

With the given direction parameters it is possible to place the Origin location at any corner of the lattice, at the center of any face of the Lattice or at the center of the body of the Lattice.

```
    */
    if (aDirection == negative)
        latticeOrigin.x = Origin.x – aInstances;
    else if (aDirection == centered)
        latticeOrigin.x = Origin.x – (aInstances/2.0);
    else /* (aDirection = positive) */
        iatticeOrigin.x = Origin.x;
    if (bDirection == negative)
        latticeOrigin.y = Origin.y – bInstances;
    else if (bDirection == centered)
        latticeOrigin.y = Origin.y – (bInstances/2.0);
    else /* (bDirection == positive) */
        latticeOrigin.y = Origin.y;
    if (cDirection == negative)
        latticeOrigin.z = Origin.z cInstances;
    else if (cDirection == centered)
        latticeOrigin.z = Origin.z – (c.Instances/2.0);
    else /* (cDirection == positive) */
        latticeorigin.z = Origin.z;
    /*
``` iv) Set the lattice location and orientation so that it is aligned with the unitCell direction vectors a, b and c and place it at latticeOrigin. In the algorithm I devised below, I actually first figure out the reverse, that is how to rotate the UnitCell vectors so they are aligned with the Cartesian Coordinate system. Then I use the reverse order and the opposite angle when orienting the Lattice. There is nothing special about this algorithm. It is typical computer graphics manipulations. I just detailed an algorithm so the process specification would be complete.

```
*/
a) determine the angles required to rotate the lattice so that
its, positive x-axis is pointing in the aVectorDirection.
We will find a rotation about the z-axis, then the y-axis to
get the x_axis aligned with the aVectorDirection.
*/
projectionOfAonXYPlane
    = < aVectorDirection.x, aVectorDirection.y, 0.0 >;
z_rotation_angle
    = HostSystem.atan
        (aVectorDirection.y / aVectorDirection.x);
z_rotation_matrix
    = CrystalSym.Matrix.createZRotationMatrix
        (z_rotation_angle);
rotated_vector
    = CrystalSym.Matrix.dotProduct
        (z_rotation_matrix, aVectorDirection);
y_rotation_angle
    = HostSystem.atan
        (rotated_vector.z / rotated_vector.x);
y_rotation_matrix
    = CrystalSym.Matrix.createYRotationMatrix
        (yrotation angle);
``` b.) determine the angle required to rotate the lattice so that its y-axis is in the SymmetryPlane and the bVectorDirection lies in the UnitCell's positive-y hemi-plane.
This will be a rotation about the x-axis.

```
*/
rotated_vector
    = CrystalSym.Matrix.dotProduct
        (z_rotation_matrix, bVectorDirection);
rotated_vector
```

-continued

```
                = CrystalSym.Matrix.dotProduct
                        (y_rotation_matrix, rotated_vector);
        x_rotation_angle
                = HostSystem.atan
                        (rotated_vector.z / rotated_vector.y);
    x_rotation_matrix
        = CrystalSym.Matrix.createXRotationMatrix
                (x_rotation_angle);
    /*
    c.) if the cDirection Vector lies in the negative-z hemi-space
    mirror the lattice z-coordinates (scale z by −1.0). This turns
    a left handed coord system to a right handed coord system. */
    rotated_vector
        = CrystalSym.Matrix.dotProduct
                (z_rotation_matrix, cVectorDirection);
        rotated_vector
                = CrystalSym.Matrix.dotProduct
                        (y_rotation_matrix, rotated_vector);
        rotated_vector
                = CrystalSym.Matrix.dotProduct
                        (x_rotation_matrix, rotated_vector);
    if (rotated_vector.z < 0.0) /* scale z by −1.0 */
        HostSystem.setScale(lattice, <1.0, 1.0, 1.0>);
    /*
    d.) rotate the lattice in the reverse order and opposite
    direction by the angles which were determined previously.
    */
    HostSystem.setRotation
        (lattice, < -x_rotation angle,
                    -y_rotation_angle,
                    -z rotation angle >);
    /*
    e.) translate the lattice so that its origin is at latticeOrigin
    */
    HostSystem.setTranslation
        (lattice, < latticeOrigin.x,
                    latticeOrigin.x,
                    latticeOrigin.y,
                    latticeOrigin.z > );
    [end optional section]
} /* end of CrystalSym.createLatticeOfUnitCells( ) */
```

VII. Detail of Matrix Methods Used in Chapter VI.

The Steps listed where these methods are called are all within Chapter VI. Some of these methods may be available within the host system, as they are standard matrix mathematics. These methods use the following standard mathematical functions: sin( ), cos( ), asin( ), acos( ), atan( ), abs( ), sqrt( ) and sqr( ). It is assumed that these functions are implemented within the host system. They are listed within Chapter III. with the prefix "HostSystem". I did not use the prefix in the descriptions in this Chapter.

Methods which implement standard computer graphics matrix functions:

i) CrystalSym.Matrix.dotProduct(aMatrix, aPoint|aVector);

Called in [optional] Steps G)ii), J)iv)a), J)iv)b), J)iv)c)

The dot product of aMatrix and aPoint or a Vector is returned as a point or vector. For a row major order matrix M[4][4], and a vector or point P[3], construct and return a transformed vector or point NP[3] as follows:

NP[0]=(M[0][0]*P[0])+(M[1][0]*P[1])+(M[2][0]*P[2])+M[3][0];

NP[1]=(M[0][1]*P[0])+(M[1][1]*P[1])+(M[2][1]*P[2])+M[3][1];

NP[2]=(M[0][2]*P[0])+(M[1][2]*P[1])+(M[2][2]*P[2])+M[3][2];

ii) CrystalSym.Matrix.combine(matrix1, matrix2, matrix3);

Mentioned in Chapter IV

Called in Step E)ii)c), I)iii)

This is a convenience function. This method combines two matrix multiplications within a single method call. The final matrix (F[4][4]) is returned and is computed by the result(TM[4][4]) of matrix1(M1[4][4]) multiplied with matrix2(M2[4][4]) being multiplied with matrix3(M3[4][4]) as follows:

```
for (i=0; i<4; i++)
{
    for (j=0; j<4; j++)
    {
        TM[i][j] = (M1[i][0] * M2[0][j]) + (M1[i][1] * M2[1][j])
                  +(M1[i][2] * M2[2][j]) + (M1[i][3] * M2[3][j]);
    }
}
for (i=0; i<4; i++)
{
    for (j=0; j<4; j++)
    {
        F[i][j] = (TM[i][0] * M3[0][j]) + (TM[i][1] * M3[1][j])
                 +(TM[i][2] * M3[2][j]) + (TM[i][3] * M3[3][j]);
    }
}
``` iii) CrystalSym.Matrix. createTranslationMatrix (x_value, y_value, z_value);

Called in Step I)iii)

This method creates and returns a matrix(T[4][4]) which will translate objects by the values specified in the parameter list.

T[0][0]=1.0; T[0][1]=0.0; T[0][2]=0.0; T[0][3]=0.0;
T[1][0]=0.0; T[1][1]=1.0; T[1][2]=0.0; T[1][3]=0.0;
T[2][0]=0.0; T[2][1]=0.0; T[2][2]=1.0; T[2][3]=0.0;
T[3][0]=x_value; T[3][1]=y_value; T[3][2]=z_value; T[3][3]=1.0;

iv) CrystalSym.Matrix.createXRotationMatrix(angle);

Called in [optional] Step J)iv)b)

This method creates and returns a matrix(RX[4][4]) which will rotate objects about the x-axis by the specified angle.

RX[0][0]=1.0; RX[0][1]=0.0; RX[0][2]=; RX[0][3]=0.0;
RX[1][0]=0.0; RX[1][1]=cos(angle); RX[1][2]=−sin(angle); RX[1][3]=0.0;
RX[2][0]=0.0; RX[2][1]=sin(angle); RX[2][2]=cos(angle); RX[2][3]=0.0;
RX[3][0]=0.0; RX[3][1]=0.0; RX[3][2]=; RX[3][3]=1.0;

v) CrystalSym.Matrix.createYRotationMatrix(angle);

Called in [optional] Step J)iv)a)

This method creates and returns a matrix(RY[4] [4]) which will rotate objects about the y-axis by the specified angle.

RY[0][0]=cos(angle); RY[0][1]=0.0; RY[0][2]=sin(angle); RY[0][3]=0.0;
RY[1][0]=0.0; RY[1][1]=1.0; RY[1][2]=0.0; RY[1][3]=0.0;
RY[2][0]=−sin(angle); RY[2][1]=0.0; RY[2][2]=cos(angle); RY[2][3]=0.0;
RY[3][0]=0.0; RY[3][1]=0.0; RY[3][2]=0.0; RY[3][3]=1.0;

vi) CrystalSytn.Matrix.createZRotationMatrix(angle);

Called in [optional] Step J)iv)a)

This method creates and returns a matrix(RZ[4] [4]) which will rotate objects about the z-axis by the specified angle.

RZ[0][0]=cos(angle); RZ[0][1]=−sin(angle); RZ[0][2]=0.0; RZ[0][3]=0.0;
RZ[1][0]=sin(angle); RZ[1][1]=cos(angle); RZ[1][2]=0.0; RZ[1][3]=0.0;

RZ[2][0]=0.0; RZ[2][1]=0.0; RZ[2][2]=1.0; RZ[2][3]=0.0;
RZ[3][0]=0.0; RZ[3][1]=0.0; RZ[3][2]=0.0; RZ[3][3]=1.0;
    iv)     CrystalSym.Matrix.createScaleMatrix(x_value, y_value, z_value);
Not called, just listed for completeness
This method creates and returns a matrix(S[4][4]) which will scale objects by the values specified in the parameter list.
S[0][0]=x_value; S[0][1]=0.0; S[0][2]=0.0; S[0][3]=0.0;
S[1][0]=0.0; S[1][1]=y_value; S[1][2]=0.0; S[1][3]=0.0;
S[2][0]=0.0; S[2][1]=0.0; S[2][2]=z_value; S[2][3]=0.0;
S[3][0]=0.0; S[3][1]=0.0; S[3][2]=0.0; S[3][3]=1.0;
Methods whose math is described in Chapter IV.
    i)     CrystalSym.Matrix.createC2U(a,b,c,alpha,beta,gamma);
Math described in Chapter
Called in Step E)ii)c)
    ii)     CrystalSym.Matrix.createU2C(a,b,c,alpha,beta,gamma);
Math described in Chapter IV, paragraph 0085)
Called in Step E)ii)c)
Methods which extract information from aMatrix. In most cases these algorithms work. There are however, matrices for which the algorithms do not work. In some cases the algorithms fail to find the scale and rotation values. This is primarily due to the nature of the trigonometric operations used in the algorithms, and sometimes is due to the imprecision of computer computation.
    i) CrystalSym.Matrix.translationValues(aMatrix);
Mentioned in Chapter III, paragraph 0069)
Called in Steps E)ii)d), I)v)
This method extracts the translation values from aMatrix (M[4][4]) and places them in a vector (VT[3]), which is returned. VT[0] is the x translation value. VT[1] is the y translation value. VT[2] is the z translation value.
VT[0]=M[3][0];
VT[1]=M[3][1];
VT[2]=M[3][2];
ii) CrystalSym.Matrix.rotationValues(aMatrix);
Mentioned in Chapter III, paragraph 0069)
Called in Step E)ii)d)
Called in CrystalSym.Matrix.scaleValues( ), which is section iii) immediately following this section.

a) This method extracts the rotation values from aMatrix(M[4][4]) and places them in a vector (VR[3]), which is returned. VR[0] is the rotation angle about the x-axis. VR[1] is the rottion angle about the y-axis. VR[2] is the rotation angle about the z-axis. The rotation order is assumed to be x-axis, y-axis, then z-axis. The algorithm would need to be adjusted to get rotation angle values for other orderings.
/*
    b) clean the matrix of "almost zero" values.
*/
for (i=0; i<4; i++)
    for (j=0; j<4; j++)
        if (abs(M[i][j]) < VERY_SMALL_VALUE)
            M[i][j] = 0.0;
/*
    c) set the denominator value
*/
denominator = sqrt(sqr(M[0][0]) + sqr(M[0][1]));
if (abs(denominator) < VERY_SMALL_VALUE)
    denominator = 0.0;
/*
    d) compute the rotation values
*/

-continued if (denominator != 0.0)
{
/*
    e) compute y rotation
*/
VR[1] = atan(−(M[0][2] / denominator));
/*
    f) compute z rotation
*/
if (asin((M[0][1] / denominator)) > 0)
{
    VR[2] = acos((M[0][0] / denominator));
}
else
{
    VR[2] = −acos((M[0][0] / denominator));
}
/*
    g) compute x rotation
*/
if ((denominator = sqrt(sqr(M[1][2]) + sqr(M[2][2]))) != 0.0)
{
    if (asin((M[1][2] / denominator)) > 0)
    {
        VR[0] = acos((M[2][2] / denominator));
    }
    else
    {
        VR[0] = −acos((M[2][2] / denominator));
    }
}
else
{
/*
    ** Either Scale of x or scale of y is zero,
    ** or rotate y is +90 or −90 degrees.
    ** But rotate y cannot be 90 degrees
    ** if we are in this part of the algorithm...
*/
    VR[0] = 0.0;
}
}
else
{
/*
    h) set rotation values for when the y angle is zero
    ** If the denominator is 0, then the y angle is 90 degrees.
    ** When the y angle is + or −90 degrees, then x and z rotations
    ** become complementary, so we can set the z angle to whatever
    ** we want and the x angle will be able to rotate to any possible
    ** angle.
*/
    VR[1] = PI/2.0;
    VR[2] = 0;
    VR[0] = asin(M[1][0]);
} iii) CrystalSym.Matrix.scaleValues(aMatrix);
Mentioned in Chapter III
Called in Step E)ii)d)

a) This method extracts the scale values from aMatrix(M[4][4]) and places them in a vector(VS[3]), which is returned. VS[0] is the scalar value for the x-axis. VS[1] is the scalar value for the y-axis. VS[2] is the scalar value for the z-axis. This method uses CrystalSym.Matrix.rotationValues( ), from Chapter VII, section ii).
/*
    b) clean the matrix of "almost zero" values.
*/
for (i=0; i<4; i++)
    for (j=0; j<4; j++)
        if (abs(M[i][j]) < VERY_SMALL_VALUE)
            M[i][j] = 0.0;
/*
    c) Get the Rotation values, place into vector VR[3]

-continued

```
*/
VR = CrystalSym.MatrixRotationValues(M);
/*
    d) Get the X scale value.
*/
denominator = sin(VR[1]);
if (abs(denominator) < VERY_SMALL_VALUE)
    denominator = 0.0;
if ((M[0][2] != 0.0) && (denominator != 0.0))
{
    VS[0] = -M[0][2] / denominator;
}
else
{
    denominator = cos(VR[1]) * sin(VR[2]);
    if (abs(denominator) < VERY_SMALL_VALUE)
        denominator = 0.0;
    if ((M[0][1] != 0.0) && (denominator != 0.0))
    {
        VS[0] = M[0][1] / denominator;
    }
    else
    {
        denominator = cos(v->rotate.y) * cos(v->rotate.z);
        if (abs(denominator) < VERY_SMALL_VALUE)
            denominator = 0.0;
        if ((M[0][0] != 0.0) && (denominator != 0.0))
        {
            VS[0] = M[0][0] / denominator;
        }
        else
        {
            VS[0] = 1.0; /* 1 instead of zero, so result looks OK */
        }
    }
}
/*
    e) Get the Y scale value.
*/
denominator = sin(VR[0]) * cos(VR[1]);
if (abs(denominator) < VERY_SMALL_VALUE)
    denominator = 0.0;
if ((M[1][2] != 0.0) && (denominator != 0.0))
{
    VS[1] = M[1][2] / denominator;
}
else
{
    denominator
        = (sin(VR[0]) * sin(VR[1]) * sin(VR[2]))
          + (cos(VR[0]) * cos(VR[2]));
    if (abs(denominator) < VERY_SMALL_VALUE)
        denominator = 0.0;
    if ((M[1][1] != 0.0) && (denominator != 0.0))
    {
        VS[1] = M[1][1] / denominator;
    }
    else
    {
        denominator
            = (sin(VR[0]) * sin(VR[1]) * cos(VR[2]))
              - (cos(VR[0]) * sin(VR[2]));
        if (abs(denominator) < VERY_SMALL_VALUE)
            denominator = 0.0;
        if ((M[1][0] != 0.0) && (denominator != 0.0))
        {
            VS[1] = M[1][0] / denominator;
        }
        else
        {
            VS[1] = 1.0; /* 1 instead of zero, so result looks OK */
        }
    }
}
/*
    f) Get the Z scale value.
*/
denominator = cos(VR[0]) * cos(VR[1]);
if (abs(denominator) < VERY_SMALL_VALUE)
    denominator = 0.0;
if ((M[2][2] != 0.0) && (denominator != 0.0))
{
    VS[2] = M[2][2] / denominator;
}
else
{
    denominator
        = (cos(VR[0]) * sin(VR[1]) * sin(VR[2]))
          - sin(VR[0]) * cos(VR[2]));
    if (abs(denominator) < VERY_SMALL_VALUE)
        denominator = 0.0;
    if ((M[2][1] != 0.0) && (denominator != 0.0))
    {
        VS[2] = M[2][1] / denominator;
    }
    else
    {
        denominator
            = (cos(VR[0]) * sin(VR[1]) * cos(VR[2]))
              + (sin(VR[0]) * sin(VR[2]));
        if (abs(denominator) < VERY_SMALL_VALUE)
            denominator = 0.0;
        if ((M[2][0] != 0.0) && (denominator != 0.0))
        {
            VS[2] = M[2][0] / denominator;
        }
        else
        {
            VS[2] = 1.0; /* 1 instead of zero, so result looks OK */
        }
    }
}
```

VIII. Summary of CrystalSym Methods Used in Chapter VI.

Methods whose descriptions or details are in previous sections. Unless otherwise indicated, locations specified by Step are within an algorithm in Chapter VI.

i) CrystalSym.createLatticeOfUnitCells( );

Detailed in Chapter VI, the algorithm that starts on paragraph 0126)

This is the method which implements the CrystalSym process.

ii) CrystalSym.UI.getSymmetryGroupCategory( );

Detailed in Chapter V

Called in Step B)iii)

iii) CrystalSym.UI.getLatticeParameters (symmetryGroupCategory, parameterName);

Detailed in Chapter V

Called in Step B)iii)

iv) CrystalSym.UI.getUnitCellParameters (symmetryGroupCategory, lattice, parameterName);

Detailed in Chapter V

Called in Step B)iii)

v) CrystalSym.UI.getSymmetryGroupParameters (symmetryGroupCategory, lattice, parameterName);

Detailed in Chapter V

Called in Step B)iii)

Methods Described Here i) CrystalSym.initSymmetryGroups( );

Called in Step A)

This method should make accessible to the CrystalSym process the symmetry operations of each symmetry group implemented by the process. These operations are stored within files which accompany this application in the Appendix CD. These files and the operations within them are described in Chapter IV.

ii) CrystalSym.setupErrorHandlers( );
Called in Step A)
Error handlers are just a smart thing to do, they are not intrinsic to the process and will be specific to the implementation, so they are not detailed in this specification.
iii) CrystalSym.UI.setUnitCellParametersFrom(object);
Called in Chapter VI, [optional] section of Step C)
This method will override some of the parameters set in Step B). The object is a single selected object and it is a unitCell object created via a previous invocation of the CrystalSym process. The parameters would had to have been stored (see Step G)). It is up to the implementation to determine which parameters to store and then, in this method, set.
iv) CrystalSym.handleTheError(errorMessage);
Called in Steps C), E)i)
This method will do whatever is necessary to properly handle the error. It is not intrinsic to the CrystalSym process. It is up to the implementation to determine how to handle errors.
v) CrystalSym.createUniqueName( );
Called in Steps D), E)ii)a), F), I)i), J)ii)
This method creates a string which will be used as an object identifier. Depending upon the system this name may need to be a unique identifier. It is up to the implementation to determine the best way to construct names for objects.
vi) CrystalSym.getSymmetryOperationsFor
(SpaceGroupCategory,
SymmetryNumber|SymmetryName)
Called in Step E)i)
This method should return a List of Matrices containing the Symmetry Operation Matrices for symmetry group specified by SymmetryNumber or SymmetryName. Valid name and number values are specified in Chapter V. The data format for the files where symmetry operation information is stored is discussed in Chapter IV. The data is within the spacegroup files in the Appendix CD.
vi) CrystalSym.List.getObjectAtIndex(aList, index);
Called in Step E)ii)c)
This method returns an object from aList as specified by index. This is really just basic array functionality and may be implemented within the host system. The place in the algorithm that this is used, aList is the List returned by a call to the method CrystalSym.getSymmetryOperationsFor( ).
viii) CrystalSym.List.add(aList, object);
Called in Step E)ii)e)
This method adds object to aList. This is really just basic array functionality and may be implemented within the host system.

The invention claimed is:

1. A computer system including a display and running a three dimensional creation and rendering application defining a host system which allows the user to create virtual objects within a three dimensional virtual space, the three dimensional creation and rendering application implementing an Application Programming Interface (API) including functionality for selecting an object or a plurality of objects, for creating either a reference to or a copy of a selected object or plurality of objects, for establishing parent/child relationships among objects, for setting the scale of an object, for setting the rotation of an object, and for setting the translation/position of an object; and
computer program code executing in said computer system and employing said API for:
creating multiple instances of at least one virtual object as selected within the host system in accordance with a selected one of a plurality of crystallographic space groups and associated parameter values,
grouping the resulting set of virtual object instances as a unit cell having an origin, and
outputting the unit cell to the host system for display to a user of the host system.

2. The computer system of claim 1, wherein the associated parameters are three dimension parameters representing vector magnitudes and three angle parameters representing angles between pairs of vectors, the dimension parameters and angle parameters together representing dimensions of a unit cell space unit cell within Cartesian Space.

3. A computer system including a display and running a three dimensional creation and rendering application defining a host system which allows the user to create virtual objects within a three dimensional virtual space, the three dimensional creation and rendering application implementing an Application Programming Interface (API) including functionality for selecting an object or a plurality of objects, for creating either a reference to or a copy of a selected object or plurality of objects, for establishing parent/child relationships among objects, for setting the scale of an object, for setting the rotation of an object, and for setting the translation/position of an object; and
computer program code executing in said computer system and employing said API for:
creating multiple instances of at least one virtual object as selected within the host system in accordance with a selected one of a plurality of crystallographic space groups and associated parameter values, each of the crystallographic space groups being defined as associated lattice parameters, a set of matrices in unit cell space, a Cartesian space to unit cell space conversion matrix C2U, and a unit cell space to Cartesian space transformation matrix U2C,
grouping the resulting set of virtual object instances as a unit cell having an origin, and
outputting the unit cell to the host system for display to a user of the host system.

4. The computer system of claim 3, wherein the associated lattice parameters are defined as:
a lattice type parameter selected from a plurality of lattice types;
three instance parameters, aInstances, bInstances and cInstances, representing the number of unit cell instances to create along each of three unit cell vector directions; and
three direction parameters, aDirection, bDirection and cDirection, representing the positioning of a lattice of unit cell instances with respect to the unit cell origin within the host system.

5. The computer system of claim 3, wherein:
multiple instances of a selected virtual object or objects are created within the host system in accordance with a selected one of a plurality of the crystallographic space groups and associated parameter values; and which method comprises:
for each matrix in unit cell space corresponding to the selected crystallographic space group:
creating an instance of the selected virtual object or objects,
multiplying the Cartesian space to unit cell space conversion matrix C2U with the matrix in unit cell space to generate an interim matrix, multiplying the interim matrix with the unit cell space to Cartesian space transformation matrix U2C to generate an operation matrix, and using the operation matrix to position and orient the instance of the selected virtual object or objects within the host system.

6. The computer system of claim 4, which further comprises creating multiple instances of the unit cell within the host system, as a lattice, according to the associated lattice parameters of the unit cell, said method comprising, for each row of the lattice, the number of which is specified by the aInstances parameter, for each column of the lattice, the number of which is specified by the bInstances parameter, and for each layer of the lattice, the number of which is specified by the cInstances parameter:

creating an instance of the unit cell;

placing and orienting the instance of the unit cell into a position corresponding to the current row, column and layer;

grouping the resulting set of unit cell instances as the lattice, and determining the position of the lattice origin;

setting the lattice location and orientation to be aligned with the unit cell direction vectors; and outputting the lattice to the host system for display to a user of the host system.

7. The computer system of claim 6, wherein each instance of the unit cell is positioned and oriented according to the current row, column and layer, which method comprises:

creating a translation matrix using the value of row as the x translation, the value of column as the y translation, and the value of layer as the z translation;

multiplying the Cartesian space to unit cell space conversion matrix C2U with the translation matrix to generate an interim matrix;

multiplying the interim matrix with the unit cell space to Cartesian space transformation matrix U2C to generate a final matrix; and using the final matrix to position and orient the unit cell instance within the host system for display to a user of the host system.

8. The computer system of claim 3, wherein the associated parameters are three dimension parameters representing vector magnitudes and three angle parameters representing angles between pairs of vectors, the dimension parameters and angle parameters together representing dimensions of a unit cell space unit cell within Cartesian Space.

9. The computer system of claim 3, wherein the associated lattice parameters are defined as:

a lattice type parameter selected from a plurality of lattice types, possible values of which are specified in the following TABLES 2 through 8:

TABLE 2

PointGroups_0D

| Parameter | Type | Value |
|---|---|---|
| Lattice | Enumerated | None/Any |

TABLE 3

PointGroups_1D, LineGroups

| Parameter | Type | Value |
|---|---|---|
| Lattice | Enumerated | member of set: { None/Any, Row } |

TABLE 4

PointGroups_2D, FriezeGroups, PlaneGroups

| Parameter | Type | Value |
|---|---|---|
| Lattice | Enumerated | member of set: { None/Any, Oblique, Rectangular/Primitive, Rectangular/Centered, Square, Hexagonal} |

TABLE 5

PointGroups_3D,

| Parameter | Type | Value |
|---|---|---|
| Lattice | Enumerated | member of set: {None/Any, Triclinic, Monoclinic, Orthorhombic, Tetragonal, Trigonal/Hexagonal, Hexagonal/Hexagonal, Cubic} |

TABLE 6

RodGroups

| Parameter | Type | Value |
|---|---|---|
| Lattice | Enumerated | member of set: {None/Any, Triclinic, Monoclinic/Inclined, Monoclinic/Orthogonal, Orthorhombic, Tetragonal, Trigonal, Hexagonal} |

TABLE 7

LayerGroups

| Parameter | Type | Value |
|---|---|---|
| Lattice | Enumerated | member of set: {None/Any, Triclinic/Oblique, Monoclinic/Oblique, Monoclinic/Rectangular, Orthorhombic/Rectangular, Tetragonal/Square, Trigonal/Hexagonal, Hexagonal/Hexagonal } |

TABLE 8

SpaceGroups

| Parameter | Type | Value |
|---|---|---|
| Lattice | Enumerated | member of set: {None/Any, Triclinic, Monoclinic/Primitive, Monoclinic/CFaceCentered, Orthorhombic/Primitive, Orthorhombic/CFaceCentered, Orthorhombic/BodyCentered, Orthorhombic/FaceCentered, Tetragonal/Primitive, Tetragonal/BodyCentered, Cubic/Primitive, Cubic/BodyCentered, Cubic/FaceCentered, Trigonal, Trigonal/Hexagonal, Hexagonal/Hexagonal } | three instance parameters, aInstances, bInstances and cInstances, representing the number of unit cell instances to create along each of three unit cell vector directions; and three direction parameters, aDirection, bDirection and cDirection, representing the positioning of a lattice of unit cell instances with respect to the unit cell origin within the host system.

10. The computer system of claim 9, which further comprises creating multiple instances of the unit cell within the host system, as a lattice, according to the associated lattice parameters of the unit cell, said method comprising, for each row of the lattice, the number of which is specified by the aInstances parameter, for each column of the lattice, the number of which is specified by the bInstances parameter, and for each layer of the lattice, the number of which is specified by the cInstances parameter:

creating an instance of the unit cell;

placing and orienting the instance of the unit cell into a position corresponding to the current row, column and layer;

grouping the resulting set of unit cell instances as the lattice, and determining the position of the lattice origin;

setting the lattice location and orientation to be aligned with the unit cell direction vectors; and outputting the lattice to the host system for display to a user of the host system.

11. The computer system of claim 10, wherein each instance of the unit cell is positioned and oriented according to the current row, column and layer, which method comprises:

creating a translation matrix using the value of row as the x translation, the value of column as the y translation, and the value of layer as the z translation;

multiplying the Cartesian space to unit cell space conversion matrix C2U with the translation matrix to generate an interim matrix;

multiplying the interim matrix with the unit cell space to Cartesian space transformation matrix U2C to generate a final matrix; and using the final matrix to position and orient the unit cell instance within the host system for display to a user of the host system.

* * * * *